Figure 1:
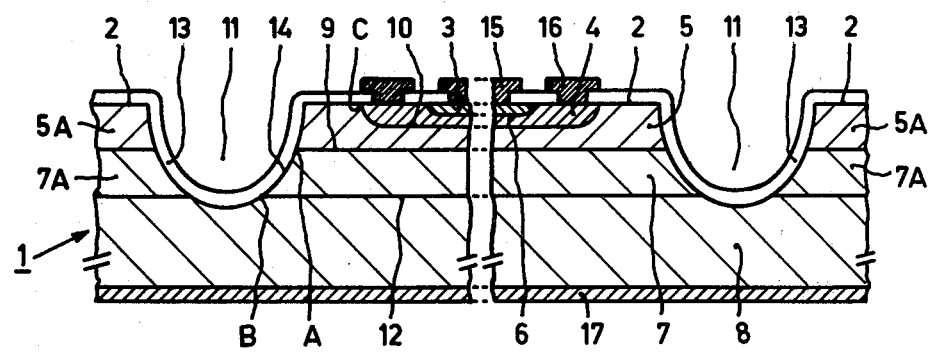

United States Patent [19]

Smulders

[11] 4,165,516
[45] Aug. 21, 1979

[54] SEMICONDUCTOR DEVICE COMPRISING TRANSISTOR WITH TWO-PART BASE AND COLLECTOR ZONES AND METHOD OF MANUFACTURING SAME

[75] Inventor: Walter H. M. M. Smulders, Eindhoven, Netherlands

[73] Assignee: U.S. Philips Corporation, New York, N.Y.

[21] Appl. No.: 900,816

[22] Filed: Apr. 27, 1978

Related U.S. Application Data

[63] Continuation of Ser. No. 668,826, Mar. 22, 1976, abandoned.

[30] Foreign Application Priority Data

Apr. 28, 1975 [NL] Netherlands ............... 7504990

[51] Int. Cl.$^2$ ........................................... H01L 29/72
[52] U.S. Cl. .................................. 357/34; 357/52; 357/56; 357/89
[58] Field of Search .................. 357/52, 55, 89, 34, 357/56

[56] References Cited

U.S. PATENT DOCUMENTS

| 3,908,187 | 9/1975 | Sheldon et al. | 357/55 |
| 3,911,472 | 10/1975 | Craft | 357/89 |
| 3,922,709 | 11/1975 | Wallmark et al. | 357/52 |

OTHER PUBLICATIONS

R. Denning et al., "Epitaxial ε-y n-p-n High-Voltage Power Transistors," IEEE Trans. on Elec. Dev., vol. ED-17#9, Sep. 1970, pp. 711-716.

Primary Examiner—Joseph E. Clawson, Jr.
Attorney, Agent, or Firm—Thomas A. Briody; Edward J. Connors, Jr.; Paul R. Miller

[57] ABSTRACT

A high voltage transistor having successively an emitter zone, a highly doped base part, a low doped base part, a low doped collector part and a highly-doped collector part. At a distance from the highly doped base part, a groove is provided which extends down into the highly doped collector part and forms therebelow a channel stopper. The groove may be passivated with neutral, or, if desired, with positively charged glass or oxide while still maintaining a high collector-base breakdown voltage.

19 Claims, 5 Drawing Figures

SEMICONDUCTOR DEVICE COMPRISING TRANSISTOR WITH TWO-PART BASE AND COLLECTOR ZONES AND METHOD OF MANUFACTURING SAME

This is a continuation, of application Ser. No. 668,826, filed Mar. 22, 1976 now abandoned.

The invention relates to a semiconductor device having a semiconductor body comprising at least a transistor having an emitter zone of a first conductivity type adjoining a substantially flat surface of the body, a base zone fo the second conductivity type which adjoins said surface, surrounds the emitte zone entirely and forms therewith a first p-n junction which terminates at the surface, and a collector zone of the first conductivity type which adjoins the base zone, forms with the base zone a second p-n junction which extends substantially parallel to the surface, the base zone comprising a more highly doped first part which surrounds the emitter zone entirely, forms therewith the first p-n junction, and a lower and substantially homogeneously doped second part which adjoins the collector zone and forms therewith the second p-n junction, the two parts of the base zone mutually forming a junction terminating at the surface, a recess which surrounds the base zone entirely and intersects the second p-n junction being provided in said surface.

The invention furthermore relates to a method of manufacturing such a device.

A semiconductor device as described above is known from British Patent Specification No. 1,098,760.

In order to obtain high voltage transistor with collector-base breakdown voltage which is as high as possible, the breakdown should preferably occur within the semiconductor material instead of at the surface. In order to achieve this, various measures have been proposed in the course of time.

One of the best known and most frequently used measures is the bevelling of the edge face of the semiconductor wafer in which the transistor is provided, at such an angle that the field strength at the edge face at the area of the line of intersection with the collector-base junction is reduced. One of the drawbacks of this method is that the passivation of the collector-base junction presents difficulties. Nor can this method be used for the manufacture of planar high voltage transistors.

However, high voltage transistors having a planar or quasi-planar structure are often desired. This is the case inter alia when such a transistor is to be combined with one or more other circuit elements to form a monolithic integrated circuit. In the case of transistors having an entirely planar structure, however, it is substantially impossible to obtain very high collector-base breakdown voltages, since the breakdown will occur either at the surface, or at the considerably curved edge of the p-n junction below the surface where the field strength is considerably higher than in the flat part of the p-n junction extending parallel to the surface.

It has been endeavoured (see, for example, U.S. Pat. No. 3,463,681) to improve this by first manufacturing a planar collector-base junction terminating at the flat surface of the silicon wafer and then etching a recess, for example a groove, in the surface at the area of the edge of the p-n junction so that the considerably curved edge part of the p-n junction disappears and only the substantially flat part of the junction which extends parallel to the surface and terminates in the groove remains. In this way a configuration is obtained in which the collector-base junction terminates on a wall part of the groove which encloses an angle with the p-n junction differing from 90°. However, this angle generally proves to be just in the wrong direction, that is to say such that as a result of this the field strength at the area of the line of intersection between the p-n junction and the wall of the groove is increased instead of decreased. This can be compensated for by covering the wall of the groove with a glass layer in which electric charge, generally a negative charge, is built up. Besides the complication of dosing the glass layer with the correct charge, a drawback of this method is that the charge of the glass layer tends to disappear at somewhat higher temperatures. Another method of preventing surface breakdown in this structure is the use of one or two field electrodes which extend on the glass layer across the p-n junction and are connected electrically respectively to the base zone, as to the base zone and the collector zone. However, this also provides an extra complication of the manufacture, while in addition the voltage across the glass layer near the edge of the field electrode is very high and may present a risk of breakdown through the glass layer, or between the two field electrodes provided in the groove.

A further drawback of the known structures is that in general extra provisions have to be made to prevent an inversion channel across the collector zone as a result of which undesired leakage currents might occur along the edge of the semiconductor plate.

One of the objects of the present invention is to avoid or at least reduce considerably the drawbacks occurring in known devices of the kind described.

The invention is inter alia based on the recognition of the fact that it is possible to give such a device such a structure that a passivation with an insulating layer, for example a glass layer, can be used without a negative charge, and, if desired, even with a positive charge, in which the use of field electrodes as described above is in general not necessary and no extra channel-stopping zones or provisions need be provided, while in addition the device may have a substantially flat surface.

A semiconductor device of the kind described in the preamble is therefore characterized according to the invention in that the collector zone comprises a substantially homogeneous, lower doped first part which forms the second p-n junction with the second part of the base zone and a second more highly doped part which forms a junction with the first part of the collector zone, which junction extends substantially parallel to the surface, and that the recess is a groove which is provided at a distance from the first part of the base zone, is coated with an electrically insulating material, intersects the second, lower doped part of the base zone and extends down into the second, more highly doped part of the collector zone, the bottom of the groove having such a high doping that the formation therein of an inversion layer is avoided.

The transistor structure according to the invention has inter alia the great advantage that for passivating the collector-base junction the groove may be coated with any dielectric material which need not contain any negative charge and, if desired, may even be charged positively, while also field electrodes may be omitted. All this is possible due to the fact that in the device according to the invention the field strength at the surface is everywhere considerably smaller than inside the body.

Generally, in the operating condition of the structure according to the invention and at the maximum permissible collector-base voltage the lower-doped second part of the base zone is depleted substantially entirely and the lower doped first part of the collector zone is depleted for the greater part, and preferably is also substantially entirely depleted, the boundaries of the collector-base depletion zone being present approximately at the area of the junction between the first and the second part of the base zone and the junction between the first and second part of the collector zone. In this case the voltage at the surface is taken up substantially entirely by a region extending between the line of intersection of the groove with the junction between the highly doped and the low doped part of the collector zone and the line of intersection of the surface with the junction between the highly-doped and the low doped part of the base zone. This is in contrast with most of the known high voltage transistors in which said voltage is substantially entirely across the low doped part of the collector zone, so across a much smaller distance, taken along the surface. As a result of all this the field strength at the surface is lower than within the body. The maximum field strength occurs at the flat part of the collector-base p-n junction which extends parallel to the surface and which is present below the highly doped part of the base zone so that the breakdown voltage is determined substantially only by the properties of the semiconductor material within the body and not by surface states or by the edge curvature of a p-n junction. As a result of this, very high collector-base breakdown voltages can be achieved, dependent upon the dopings.

A further advantage of the device according to the invention is that, since no breakdown occurs at the surface, the overall thickness of the low-doped part of the base zone and of the low-doped part of the collector zone may be smaller than in a transistor having the same permissible collector-base voltage in which surface breakdown does occur, which leads to a higher voltage of the cut off frequency and to a higher gain factor, both at high current strength.

The invention furthermore relates to a very suitable method of manufacturing the device described. According to the invention, this method is characterized in that the starting material is a highly doped substrate of the first conductivity type, that a first lower doped layer of the first conductivity type and a second layer of the second conductivity type are grown thereon successively and epitaxially and without the device being removed from the growth apparatus, that doping atoms to form a more highly doped region of the second conductivity type are then provided selectively in a part of the surface and over a part of the thickness of the second layer, after which an emitter zone of the first conductivity type is provided in said more highly doped region and a groove is formed in the surface at a distance from the more highly doped region of the second conductivity type, which groove surrounds said more highly doped region and extends down into the substrate, after which the groove is coated with an insulating layer.

It is of great importance that the epitaxial growth process should not be interrupted between the growth of the n and p-type material, since, in the case of such an interruption, impurities may deposit on the surface and, when growing is continued, may give rise to lattice disturbances just in those places where the field strength becomes maximum. This would give rise to a decrease of the breakdown voltage. At the beginning of the epitaxial growth this plays no part since the dopant of the highly-doped substrate during the process diffuses into the lower-doped collector layer, so that the lattice defects arisen on the original substrate surface become located in the substantially field-free region.

The invention will now be described in greater detail with reference to a few embodiments and the drawing, in which FIG. 1 is a diagrammatic cross-sectional view of a semiconductor device according to the invention and.

FIGS. 2 to 5 show the device of FIG. 1 in successive stages of manufacture by using the method according to the invention.

The figures are diagrammatic and not drawn to scale, inter alia the dimensions in the direction of thickness being considerably exaggerated for clarity. Corresponding parts are generally referred to by the same reference numerals. Semiconductor zones of the same conductivity type are shaded in the same direction.

FIG. 1 is a diagrammatic cross-sectional view of a semiconductor device according to the invention. The device comprises a semiconductor body 1, in this example of silicon, in which a high voltage transistor is provided. The high voltage transistor comprises an emitter zone 3 of a first conductivity type, preferably, as in this example, of the n-conductivity type, adjoining a substantially flat surface 2 of the body. The high voltage transistor furthermore comprises a p-type base zone (4, 5) which adjoins the surface 2 and which surrounds the emitter zone 3 entirely and forms therewith a first p-n junction 6 terminating at the surface 2, and a base zone-adjoining n-type collector zone (7, 8) which forms with the base zone a second p-n junction 9 extending substantially parallel to the surface 2. The base zone comprises a more highly doped first part 4 which surrounds the emitter zone 3 entirely and forms therewith the p-n junction 6, and a lower doped second part 5 having a substantially homogeneous doping concentration, which second part 5 adjoins the collector zone and forms therewith the second p-n junction 9. The two parts 4 and 5 of the base zone mutually form a junction 10 terminating at the surface 2. In the surface 2 is furthermore provided a recess 11 which surrounds the base zone (4, 5) entirely and intersects the second p-n junction 9.

According to the invention, the collector zone comprises a substantially homogeneous lower doped first part 7, in this example in the form of an epitaxial layer, which part forms the second p-n junction 9 with the second part 5 of the base zone, and a second more highly doped part 8 which forms, with the first part 7 of the collector zone, a junction 12 extending substantially parallel to the surface 2. Finally, according to the invention, the said recess is formed by a groove 11 which is coated with an electrically insulating material 13 and is provided at a distance from the first part 4 of the base zone, which groove intersects the n-type conductive epitaxial layer 7 and extends down into the more highly doped second part of the collector zone, the doping of said second part 8 being so high that the bottom of the groove has a sufficiently high doping to avoid the formation of an inversion layer in the bottom of the groove.

Due to its favourable structure, the transistor according to the invention, may show a very high collector base breakdown voltage in spite of the fact that the bevel of the collector-base junction 9 at the area of the groove 11 is usually unfavourable. In this example the doping of the part 5 of the base zone is higher than that of the part 7 of the collector zone, in which case, with a favourable angle of bevel, the acute angle would not lie in the part 5 of the base zone but in the lower-doped part 7 of the collector zone. The invention is therefore of particular interest in the case in which the first lower doped part of the collector zone has a lower doping than the second lower doped part of the base zone.

Of great importance is also the advantage that, according to the invention and without extra measures or process steps, a channel stopping zone is obtained in the highly doped bottom of the groove so that an undesired leakage path to the edge of the semiconductor plate is avoided.

In addition, although this is not strictly necessary, in the example described the doping of the second part 5 of the base zone according to a preferred embodiment is such that at the highest admissible collector-base voltage the parts 5 and 7 are both depleted substantially entirely. For that purpose, the lower-doped second part 5 of the base zone beside the first more highly doped first part 4 between the surface 2 and the second p-n junction (the collector-base junction 9) should have an overall doping of at most $3 \times 10^{12}$ atoms per square centimeter and preferably, as in the present example, of $1.5 \times 10^{12}$ atoms per square centimeter. In this case the whole base-collector voltage at the surface 2 and the wall 14 of the groove 11 is taken up substantially between the points B and C (see FIG. 1) so over a large length along the surface, instead of between the points A and B as is the case in many known transistors. As a result of this, the surface field strength is everywhere comparatively low in such manner that, according to a preferred embodiment, the groove 11 may be coated with a glass layer in which substantially no electric charges are incorporated. The groove may even be coated with a dielectric material having a positive electric charge, for example, with a thermally grown layer of silicon oxide. This is an important advantage since glass layers with incorporated negative charge which are usually required in prior art transistors are difficult to manufacture and in addition lose their charge entirely or partiall at temperatures above approximately 120° C.

Various preferred embodiments of the device result in an optimum collector-base breakdown voltage. For example, the second p-n junction 9 is preferably located at a distance from the surface 2 which is more than twice the distance the junction 10 (between the parts 4 and 5 of the base zone) to the surface 2. In the example described the distance of the junction 9 to the surface 2 is 25 microns and the distance from the junction 10 to the surface 2 is 10 microns, so that this condition is fulfilled.

According to another preferred embodiment, in order to obtain a surface field strength which is as low as possible, the distance between the edge of the groove 11 and the first part 4 of the base zone, measured in a direction parallel to the surface 2, is at least equal to the thickness of the first part 7 of the collector zone. In this example the distance between the edge of the groove 11 and the part 4 of the base zone is 200 microns and the thickness of the layer 7 is 45 microns so that this condition is also fulfilled.

In order to obtain a very high breakdown voltage, the doping of the high-ohmic collector should also remain between a certain limit and should preferably be at most $2 \times 10^{14}$ doping atoms per c.c. In this example, said doping is $1.5 \times 10^{14}$ atoms per c.c. and the collector-base breakdown voltage is more than 1000 volts. The doping of the part 4 of the base zone which serves to prevent punch-through through the base zone, and also serves as a base contact zone, is approximately $10^{17}$ atoms per c.c. (resistance per square measured at the surface 50 Ohm per square).

The formation of the p-type inversion channel in the bottom of the groove 11 should be avoided according to the invention to prevent a possible connection of the base zone 5 via a continuous p-type channel to the edge part 5A of the base layer and to the poorly defined edge surface of the plate. For that purpose, the doping of the second more highly doped part 8 of the collector zone at the area of the bottom of the groove is preferably at least $5 \times 10^{17}$ atoms per c.c. In this example said doping is approximately $5 \times 10^{18}$ atoms per c.c., amply sufficient for the formation of an efficient channel-stopping zone.

The inner diameter of the groove 11 is approximately 3000 microns, the width of the groove is approximately 250 microns. The annular groove 11 in this example is circular but may also have a different shape and be, for example, square or rectangular, having preferably rounded-off corners. The emitter and base zones are contacted via windows in the oxide layer 13 by means of the metal layers 15 and 16. The collector zone is contacted at the bottom of the plate to a metal layer 17.

Figure 2:
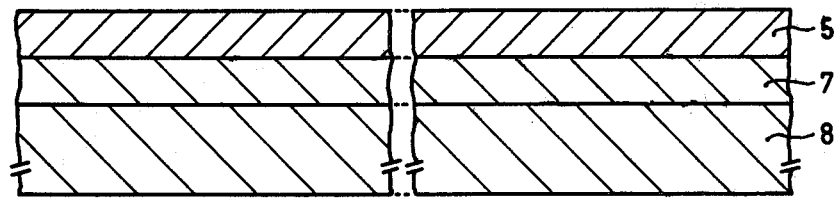

According to the invention, the semiconductor device described can advantageously be manufactured as follows. Starting material (see FIG. 2) is a highly doped n-type silicon substrate 8 having a doping of approximately $5 \times 10^{18}$ atoms per c.c. and a thickness of approximately 200 microns. On said substrate are grown epitaxially and successively and without removing the silicon plate from the apparatus, an approximately 60 microns thick n-type layer 7 and an approximately 25 microns thick p-type layer 5, for example, by thermal decomposition of $SiCl_4$, while using epitaxial growth methods generally known in semiconductor technology. The layer 7 preferably has a doping of at most $2 \times 10^{14}$ atoms per c.c., in this example of $1.5 \times 10^{14}$ atoms per c.c. In this example the layer 5 has a doping of $5 \times 10^{14}$ atoms per c.c. The structure shown in FIG. 2 is then obtained.

Figure 3:
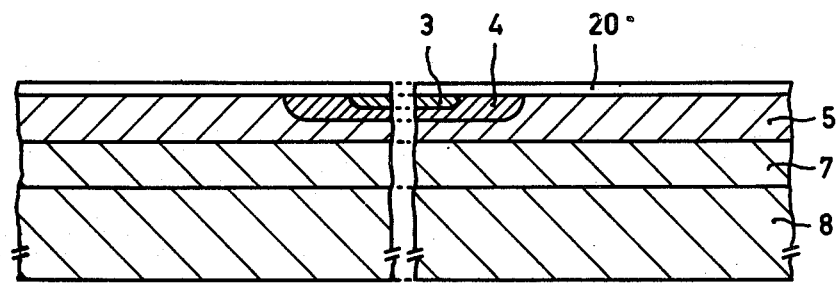
Figure 4:
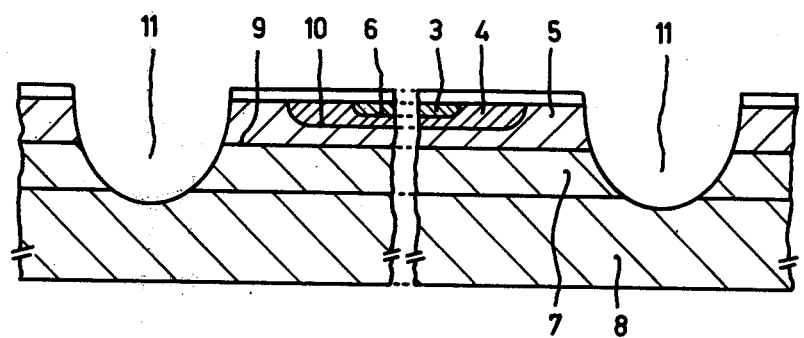
Figure 5:
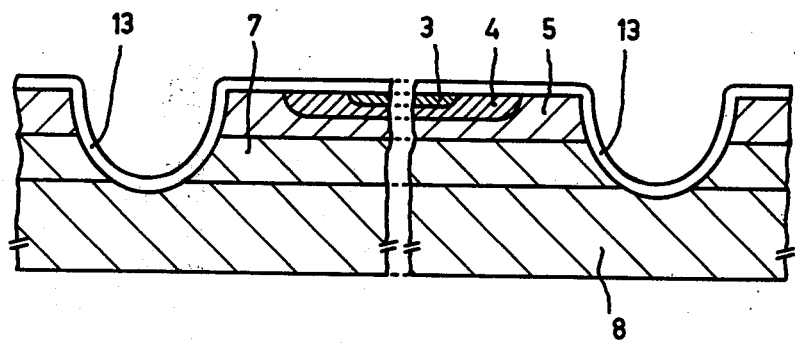

The surface is then provided with a layer 20 of silicon oxide, for example by thermal oxidation, after which doping atoms are selectively provided in a part of the surface and over a part of the thickness of the second layer 5 by diffusion while using known photolithographic etching methods, so as to form a more highly doped p-type base region 4 (for example, by in-diffusion of boron) and an n-type emitter zone 3 present in said region 4 (for example by in-diffusing phosphorus). During said diffusion, the provided zones 3 and 4 are covered with an oxide layer or glass layer; for simplicity, the layer 20 in this example is drawn so as to have equal thickness everywhere, although this need not be the case. The oxide layer may also be removed entirely after providing the zones 3 and 4 and be replaced by a fresh layer 20. The resulting structure is shown in FIG. 3.

Again while using conventionally used photolithographic etching methods, a groove 11 is formed in the surface at a distance from the more highly doped p-type region 4, which groove surrounds said region 4 and extends down into the substrate, after which the groove 11 is coated with a glass layer 13. Said glass layer 13 may be provided in any arbitrary manner and need not contain any incorporated electric charge. The layer may be obtained, for example, by thermal oxidation, in which case a certain redistribution of the dopings in the semiconductor body should, of course, be taken into account. The glass layer may also be obtained pyrolytically in known manner by vapor-depositing silicon oxide or by means of electrophoresis, or be obtained by providing and then sintering a glass mass. In accordance with the method used, the groove 11 will be filled with glass to a greater or smaller extent. Finally the contact holes and the metallisation are provided, after which the device is provided with a suitable envelope.

It is of importance to note that during the subsequent treatments at high temperature the layer 7 ultimately obtains a thickness of 45 microns by outdiffusion of donors from the substrate. The lattice defects originally formed on the interface of the substrate and the layer 7 become located within the highly doped n-type region 8 which is substantially field free so that said lattice defects are harmless there. As a result of the successive provision of the layers 7 and 5 without interruption, substantially no lattice defects occur at the interface 9 therebetween.

Of course, the invention is not restricted to the embodiment described, since may variations are possible to those skilled in the art without departing from the scope of this invention. For example, instead of an npn transistor, a pnp transistor may also be used. In certain circumstances, the low-doped part of the base zone may be formed, instead of by an epitaxial layer, also by a diffused layer having a very flat diffusion profile obtained, for example, by diffusion of aluminium. In certain circumstances, the low-doped part of the collector zone may also be formed, instead of by an epitaxial layer, by the starting material of the semiconductor plate in which the highly doped part of the collector zone may then be provided, for example, by diffusion. The edge parts 5A in FIG. 1, formed by the method of manufacturing described, may be omitted when other methods are used in which the layer 5 does not extend throughout the surface. Furthermore, in certain circumstances, the parts 5A and 7A in FIG. 1 may be omitted for the greater part by cutting the semiconductor plate within the outer edge of the groove 11 but while maintaining the channel-stopping groove bottom. Other variations are possible, for example, by the choice of a semiconductor material other than silicon, for example germanium or GaAs, and by a different choice of the material for the dielectric layers used.

What is claimed is:

1. A semiconductor device comprising:
   (a) a semiconductor body having a substantially flat surface and comprising at least a transistor,
   (b) said transistor having,
      (i) an emitter zone of first conductivity type adjoining said flat surface,
      (ii) a base zone of second conductivity type which adjoins said flat surface and surrounds said emitter zone entirely, said emitter and base zones forming a first p,n junction which terminates at said flat surface, and
      (iii) a collector zone of said first conductivity type which adjoins said base zone, said collector zone forming with said base zone a second p,n junction which extends substantially parallel to said surface, said base zone comprising both a more highly doped first part which entirely surrounds and completely contacts the emitter zone to form therewith said first p,n junction, and a lower and substantially homogenously doped second part which adjoins said collector zone and forms therewith said second p,n junction, said two parts of said base zone mutually forming a certain junction terminating at said flat surface,
   (c) a groove provided in said flat surface, which groove surrounds said base zone entirely and intersects said second p,n junction, said flat surface extending at both sides of said groove,
   (d) said collector zone comprising a substantially homogenous, lower-doped first part which forms said second p,n junction with said second part of said base zone and a more highly-doped second part which forms another junction with said first part of said collector zone, said other junction extending substantially parallel to said surface, said groove being provided at a distance from said first part of said base zone and being coated with an electrically insulating material which is substantially free of negative electric charges, which groove intersects only said second, lower-doped part of said base zone and extends down into said second, more highly doped part of said collector zone, the bottom of said groove having such a high doping that the formation therein of an inversion layer is avoided.

2. A semiconductor device as claim 1, wherein said lower-doped first part of said collector zone has a lower doping concentration than the lower-doped second part of said base zone.

3. A semiconductor device as in claim 1, wherein that much of said lower-doped second part of said base zone that is located beside said more highly doped first part of said base zone, has between said surface and said second p,n junction an overall doping level of at most $3 \times 10^{12}$ atoms per square centimeter.

4. A semiconductor device as in claim 3, wherein said doping level is about $1.5 \times 10^{12}$ atoms per square centimeter.

5. A semiconductor device as in claim 1, wherein said groove is coated with a glass layer that is substantially free of electric charges.

6. A semiconductor device as in claim 1, wherein said groove is coated with a dielectric material having a positive electric charge.

7. A semiconductor device as in claim 1, wherein the distance of said second p,n junction from said surface is more than twice the distance from said surface to said junction between said first and second parts of said base zone.

8. A semiconductor device as in claim 1, wherein the distance between the edge of said groove and said highly doped first part of said base zone, measured in a direction parallel to the surface, is at least equal to the thickness of the low-doped first part of said collector zone.

9. A semiconductor device as in claim 1, wherein said first part of said collector zone has a doping concentration of at most $2 \times 10^{14}$ atoms per c.c.

10. A semiconductor device as in claim 1, wherein the doping concentration of said more highly-doped second part of said collector zone at the area of the bottom of said groove is at least $5 \times 10^{17}$ atoms per c.c.

11. A semiconductor device as in claim 1, wherein said emitter zone has an n-type conductivity.

12. A semiconductor device comprising:
(a) a semiconductor body having a substantially flat surface and comprising at least a transistor,
(b) said transistor having,
  (i) an emitter zone of first conductivity type adjoining said flat surface,
  (ii) a base zone of second conductivity type which adjoins said flat surface and surrounds said emitter zone entirely, said emitter and base zone forming a first p,n junction which terminates at said flat surface, and
  (iii) a collector zone of said first conductivity type which adjoins said base zone, said collector zone forming with said base zone a second p,n junction which extends substantially parallel to said surface, said base zone comprising both a more highly doped first part which entirely surrounds and completely contacts the emitter zone to form therewith said first p,n junction, and a lower and substantially homogenously doped second part which adjoins said collector zone and forms therewith said second p,n junction, said two parts of said base zone mutually forming a certain junction terminating at said flat surface, wherein said lower-doped second part of said base zone located adjacent said more highly doped first part of said base zone has between said flat surface and said second p,n junction an overall doping level of at most $3 \times 10^{12}$ atoms per square centimeter,
(c) a groove provided in said flat surface, which groove surrounds said base zone entirely and intersects said second p,n junction, said flat surface extending at both sides of said groove,
(d) said collector zone comprising a substantially homogenous, lower-doped first part which forms said second p,n junction with said second part of said base zone and a more highly-doped second part which forms another junction with said first part of said collector zone, said another junction extending substantially parallel to said surface, wherein said first part of said collector zone has a doping concentration of at most $2 \times 10^{14}$ atoms per c.c., and said more highly doped second part of said collector zone has a doping concentration at the area of the bottom of said groove at least $5 \times 10^{17}$ atoms per c.c., said groove being provided at a distance from said first part of said base zone and being coated with an electrically insulating material which is substantially free of negative electric charges, which groove interesects only said second, lower-doped part of said base zone and extends down into said second, more highly doped part of said collector zone, the bottom of said groove having such a high doping that the formation therein of an inversion layer is avoided.

13. A semiconductor device as in claim 12, wherein said lower-doped first part of said collector zone has a lower doping concentration than the lower-doped second part of said base zone.

14. A semiconductor device as in claim 12, wherein said doping level of said lower doped second part is about $1.5 \times 10^{12}$ atoms per square centimeter.

15. A semiconductor device as in claim 12, wherein said groove is coated with a glass layer that is substantially free of electric charges.

16. A semiconductor device as in claim 12, wherein said groove is coated with a dielectric material having a positive electric charge.

17. A semiconductor device as claim 12, wherein the distance of said second p,n junction from said surface is more than twice the distance from said surface to said junction between said first and second parts of said base zone.

18. A semiconductor device as in claim 12, wherein the distance between the edge of said groove and said highly doped first part of said base zone, measured in a direction parallel to the surface, is at least equal to the thickness of the low-doped first part of said collector zone.

19. A semiconductor device as in claim 12, wherein said emitter zone has an n-type conductivity.

* * * * *